United States Patent
Kang et al.

(10) Patent No.: US 11,625,062 B2
(45) Date of Patent: Apr. 11, 2023

(54) CLOCK DISTRIBUTION CIRCUIT AND SEMICONDUCTOR APPARATUS INCLUDING THE SAME

(71) Applicant: SK hynix Inc., Icheon-si (KR)

(72) Inventors: Ji Hyo Kang, Icheon-si (KR); Kyung Hoon Kim, Icheon-si (KR); Jae Hyeok Yang, Icheon-si (KR); Sang Yeon Byeon, Icheon-si (KR); Gang Sik Lee, Icheon-si (KR); Joo Hyung Chae, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 188 days.

(21) Appl. No.: 17/226,952

(22) Filed: Apr. 9, 2021

(65) Prior Publication Data
US 2022/0155814 A1    May 19, 2022

(30) Foreign Application Priority Data
Nov. 19, 2020    (KR) .......................... 10-2020-0155737

(51) Int. Cl.
*G06F 1/10*    (2006.01)
*H03K 19/096*    (2006.01)

(52) U.S. Cl.
CPC ........... *G06F 1/10* (2013.01); *H03K 19/0963* (2013.01)

(58) Field of Classification Search
CPC ..... G06F 1/10; G06F 1/04; G06F 1/06; G06F 1/08
USPC ........................................................ 327/291
See application file for complete search history.

(56) References Cited

U.S. PATENT DOCUMENTS

2019/0253055 A1 *    8/2019    Jang .......................... G06F 1/10

* cited by examiner

*Primary Examiner* — Tomi Skibinski
(74) *Attorney, Agent, or Firm* — William Park & Associates Ltd.

(57) ABSTRACT

Devices for reducing power consumption and skew for transmission of signals in a clock distribution circuit are described. A global distribution circuit is configured to divide external clock signals to generate first divided multiphase clock signals and divide one of the first divided multiphase clock signals to generate a reference clock signal. A local distribution circuit is configured to generate second divided multiphase clock signals according to a portion of the first divided multiphase clock signals and the reference clock signal.

20 Claims, 9 Drawing Sheets

CLOCK DISTRIBUTION CIRCUIT AND SEMICONDUCTOR APPARATUS INCLUDING THE SAME

CROSS-REFERENCES TO RELATED APPLICATION

The present application claims priority under 35 U.S.C. § 119(a) to Korean application number 10-2020-0155737, filed on Nov. 19, 2020, in the Korean Intellectual Property Office, which is incorporated herein by reference in its entirety.

BACKGROUND

1. Technical Field

Various embodiments generally relate to a semiconductor circuit, and particularly, to a clock distribution circuit and a semiconductor apparatus including the same.

2. Related Art

A semiconductor apparatus includes a clock distribution circuit for distributing external clock signals, for example, clock signals provided from a host, to various internal circuit configurations.

Since the clock distribution circuit needs to receive the external clock signals and distribute the external clock signals to each of input/output terminals, power consumption may be considerable and a skew problem may occur in a transmission process.

SUMMARY

Various embodiments are directed to providing a clock distribution circuit capable of reducing power consumption and a skew and a semiconductor apparatus including the same.

In an embodiment, a clock distribution circuit may include: a global distribution circuit and a local distribution circuit. The global distribution circuit may be configured to divide external clock signals to generate first divided multiphase clock signals and divide any one of the first divided multiphase clock signals to generate a reference clock signal. The local distribution circuit may be configured to generate second divided multiphase clock signals according to a portion of the first divided multiphase clock signals and the reference clock signal.

In an embodiment, a semiconductor apparatus may include: a first divider, a second divider, a plurality of clock generation circuits and a plurality of input/output terminals. The first divider may be configured to divide external clock signals to generate first divided multiphase clock signals. The second divider may be configured to output, as a reference clock signal, one of signals generated by dividing the first divided multiphase clock signals. The plurality of clock generation circuits may each be configured to generate second divided multiphase clock signals according to one, which corresponds to each of the plurality of clock generation circuits among the reference clock signal and shifted reference clock signals, and a portion of the first divided multiphase clock signals. The plurality of input/output terminals may each be configured to perform data transmission and reception according to the first divided multiphase clock signals and the second divided multiphase clock signals.

In an embodiment, a semiconductor apparatus may include: a plurality of input/output terminals, a global distribution circuit, and a local distribution circuit. The plurality of input/output terminals may each be configured to perform data transmission and reception according to first divided multiphase clock signals of at least 2-phase or more and second divided multiphase clock signals of at least 2-phase. The global distribution circuit may be configured to divide external clock signals to generate the first divided multiphase clock signals and divide any one of the first divided multiphase clock signals to generate a 1-phase reference clock signal. The local distribution circuit may be configured to generate the second divided multiphase clock signals according to a portion of the first divided multiphase clock signals and the reference clock signal.

DETAILED DESCRIPTION

Hereinafter, embodiments of the present disclosure will be described in more detail with reference to the accompanying drawings.

Figure 1:
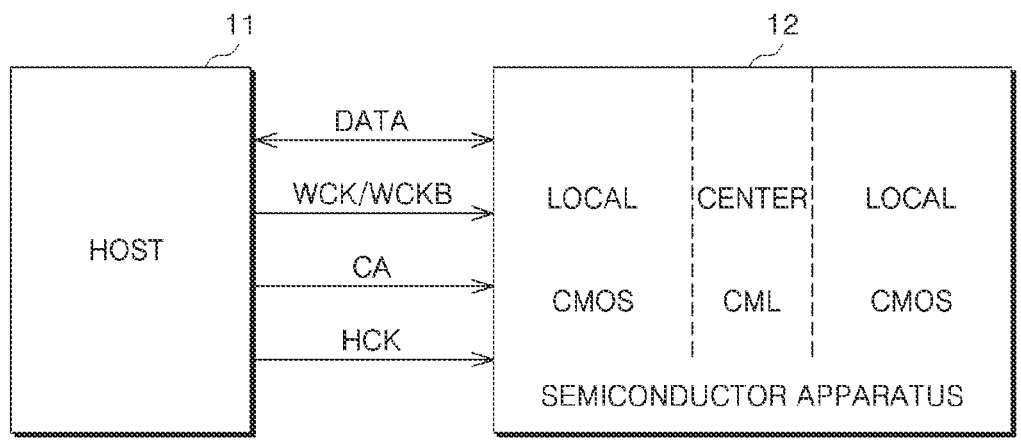
FIG. 1 is a block diagram illustrating a configuration of a data processing system in accordance with an embodiment of the present disclosure.

FIG. 1 is a block diagram illustrating a configuration of a data processing system 10 in accordance with an embodiment of the present disclosure.

Referring to FIG. 1, the data processing system 10 in accordance with the embodiment may include a host 11 and a semiconductor apparatus 12.

The host 11 may provide clock signals HCK and WCK/WCKB, and a command and address signal CA to the semiconductor apparatus 12, and exchange data DATA with the semiconductor apparatus 12.

Hereinafter, the clock signals HCK and WCK/WCKB will be referred to as external clock signals on the basis of the semiconductor apparatus 12.

The host 11 may be, for example, a memory controller such as a central processing unit (CPU) or a graphics processing unit (GPU).

A first external clock signal HCK is a clock signal related to the command and address signal CA, and may be used as a reference signal when the semiconductor apparatus 12 receives the command and address signal CA.

Second external clock signals WCK/WCKB are clock signals related to the data DATA, and in an embodiment, a differential clock signal is used as an example, and a signal phase clock signal may be used. The second external clock signals WCK/WCKB may be used as reference signals when the semiconductor apparatus 12 receives the data DATA.

Each of the second external clock signals WCK/WCKB may have a relatively higher frequency than the first external clock signal HCK.

Each of the second external clock signals WCK/WCKB may have a frequency of, for example, 8 GHz, whereas the first external clock signal HCK may have a frequency of, for example, 1 GHz, which is a relatively lower frequency than the second external clock signals WCK/WCKB.

The semiconductor apparatus 12 may be, for example, a memory apparatus.

Logic circuits included in the semiconductor apparatus 12 may be classified into current mode logic (CML) circuits and complementary metal-oxide semiconductor (CMOS) circuits according to a signal processing method thereof.

Regions of the semiconductor apparatus 12 may be divided into a first region where the CML circuits are disposed and a second region where the CMOS circuits are disposed.

For convenience of description, the regions of the semiconductor apparatus 12 may be divided into a center region (CENTER CML) and local regions (LOCAL CMOS), wherein the center region (CENTER CML) corresponds to the first region and the local regions (LOCAL CMOS) correspond to the second region.

Activation states of the circuits in the center region (CENTER CML) may be substantially maintained regardless of a read/write operation of the semiconductor apparatus.

Of course, a portion of the CML-level clock signals may be deactivated by an instruction such as power-down mode and refresh.

Circuits in the local regions (LOCAL CMOS) may be activated or deactivated according to the read/write operation of the semiconductor apparatus.

The CML circuits in the center region (CENTER CML) may transfer signals input thereto to other CML circuits that are relatively closer than the local region (LOCAL CMOS). On the other hand, the CMOS circuits in the local region (LOCAL CMOS) may receive signals, which are processed at the CML level in the center region (CENTER CML), through a global line having a relatively larger loading than an internal signal line in the center region (CENTER CML), and convert the signals into signals having the CMOS level.

Figure 2:
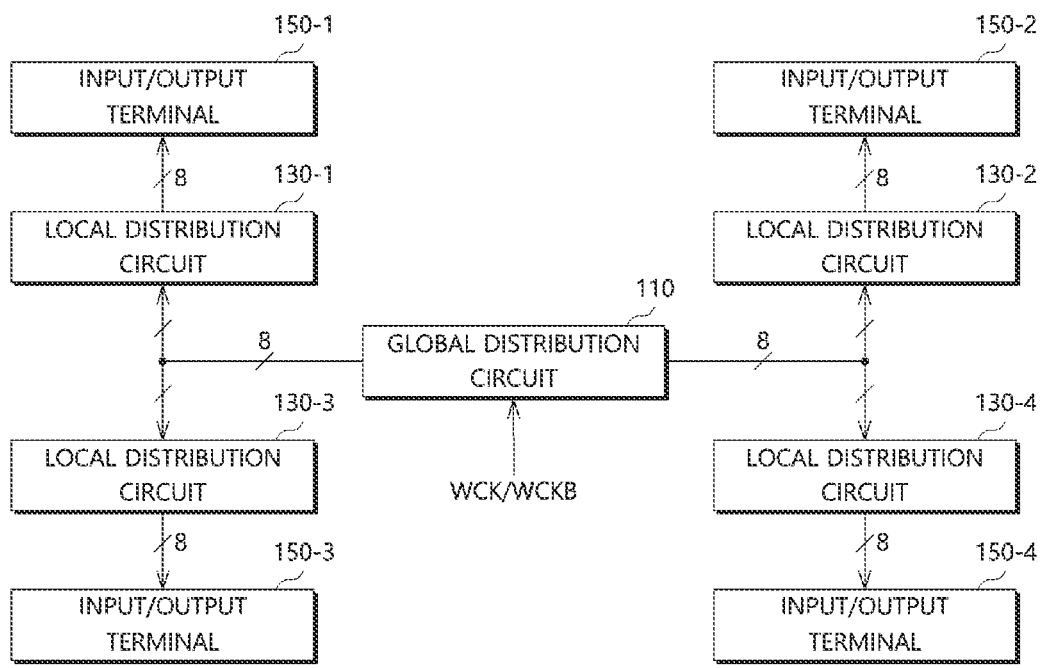
FIG. 2 is a block diagram illustrating a configuration of a semiconductor apparatus in accordance with an embodiment of the present disclosure.

FIG. 2 is a block diagram illustrating a configuration of a semiconductor apparatus 100 in accordance with an embodiment of the present disclosure.

Referring to FIG. 2, the semiconductor apparatus 100 in accordance with the embodiment may include a global distribution circuit 110, a plurality of local distribution circuits 130-1 to 130-4, and a plurality of input/output terminals 150-1 to 150-4.

The global distribution circuit 110 may divide the external clock signals WCK/WCKB to generate first divided multiphase clock signals and second divided multiphase clock signals. For example, the first divided multiphase clock signals may be 4-phase clock signals obtained by 2-dividing the external clock signals WCK/WCKB, and the second divided multiphase clock signals may be 4-phase clock signals obtained by 2-dividing the first divided multiphase clock signals.

The first divided multiphase clock signals and the second divided multiphase clock signals may each have the CML level.

The plurality of local distribution circuits 130-1 to 130-4 may have substantially the same configuration.

The local distribution circuit 130-1 may convert the first divided multiphase clock signals and the second divided multiphase clock signals into signals having the CMOS level and output the signals having the CMOS level.

The first divided multiphase clock signals and the second divided multiphase clock signals having the CMOS level, which are outputted from each of the plurality of local distribution circuits 130-1 to 130-4, may be provided to the plurality of input/output terminals 150-1 to 150-4, respectively.

The plurality of input/output terminals 150-1 to 150-4 may perform data transmission and reception according to the first divided multiphase clock signals and the second divided multiphase clock signals.

The plurality of input/output terminals 150-1 to 150-4 may have substantially the same configuration.

Each of the plurality of input/output terminals 150-1 to 150-4 may include a DQ pad, that is, an input/output pad, and a transmission/reception circuit (not shown in FIG. 2).

Figure 3:
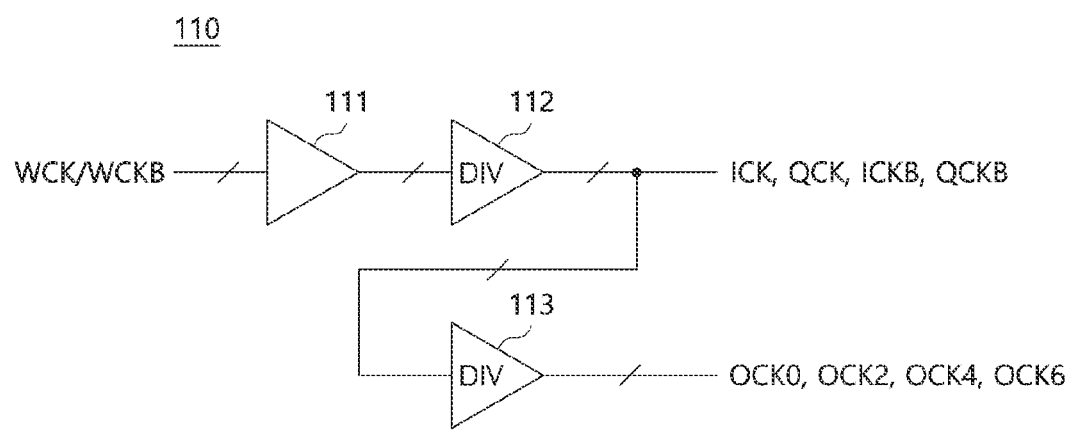
FIG. 3 is a diagram illustrating a configuration of a global distribution circuit of FIG. 2.

FIG. 3 is a diagram illustrating a configuration of the global distribution circuit 110 of FIG. 2.

Referring to FIG. 3, the global distribution circuit 110 may include a buffer 111, a first divider (DIV) 112, and a second divider (DIV) 113.

The first divider (DIV) 112 may divide the external clock signals WCK/WCKB received through the buffer 111 to generate the first divided multiphase clock signals ICK, QCK, ICKB, and QCKB.

For example, the first divided multiphase clock signals ICK, QCK, ICKB, and QCKB may be generated by 2-dividing the external clock signals WCK/WCKB. The first divided multiphase clock signals ICK, QCK, ICKB, and QCKB may have a frequency corresponding to ½ of that of the external clock signals WCK/WCKB.

The second divider (DIV) 113 may divide the first divided multiphase clock signals ICK, QCK, ICKB, and QCKB to generate the second divided multiphase clock signals OCK0, OCK2, OCK4, and OCK6.

For example, the second divided multiphase clock signals OCK0, OCK2, OCK4, and OCK6 may be generated by 2-dividing the first divided multiphase clock signals ICK, QCK, ICKB, and QCKB. The second divided multiphase clock signals OCK0, OCK2, OCK4, and OCK6 may have a frequency corresponding to ½ of that of the first divided multiphase clock signals ICK, QCK, ICKB, and QCKB and may have a frequency corresponding to ¼ of that of the external clock signals WCK/WCKB.

Figure 4:
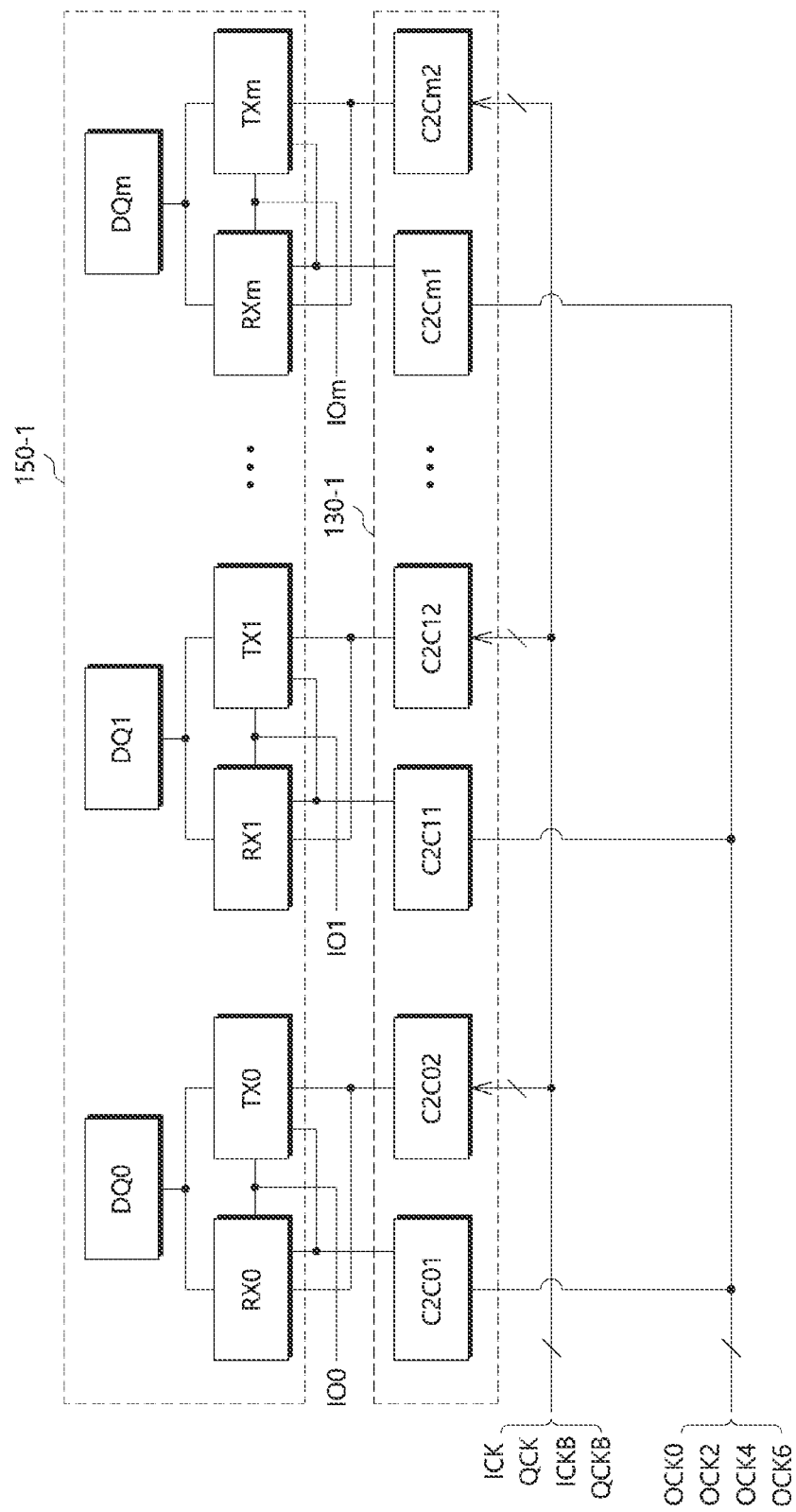
FIG. 4 is a block diagram illustrating a configuration of a local distribution circuit and an input/output terminal of FIG. 2.
Figure 5:
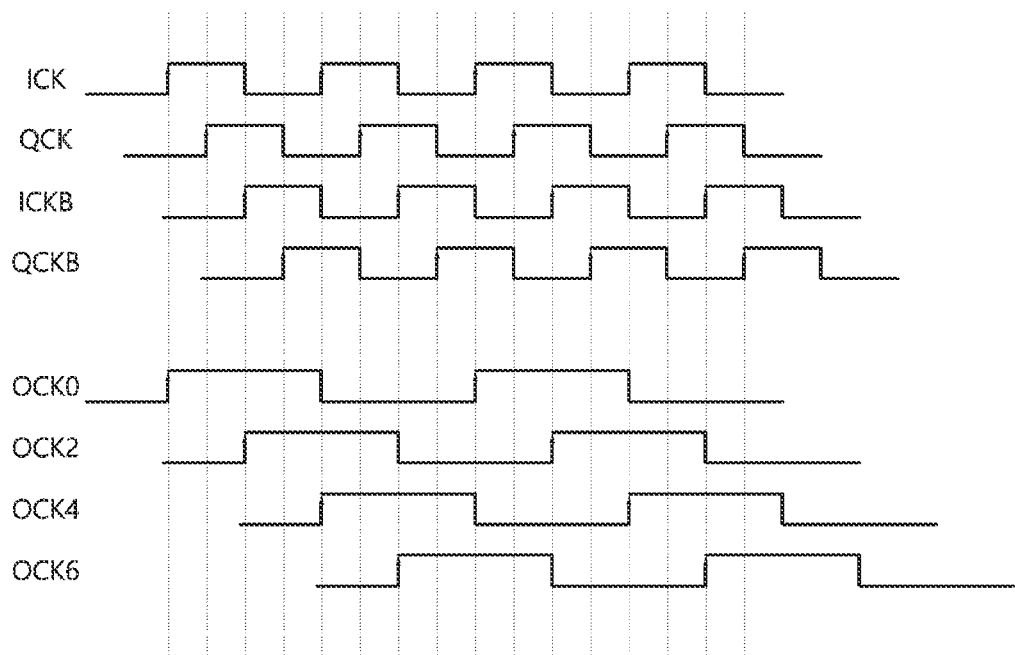
FIG. 5 is a diagram illustrating an output waveform of the local distribution circuit of FIG. 4.

FIG. 4 is a block diagram illustrating a configuration of the local distribution circuit 130-1 and the input/output terminal 150-1 of FIG. 2, and FIG. 5 is a diagram illustrating an output waveform of the local distribution circuit 130-1 of FIG. 4.

Referring to FIG. 4, the local distribution circuit 130-1 may include a plurality of converters C2C01, C2C02, C2C11, C2C12, . . . , C2Cm1, C2Cm2.

Each of the plurality of converters C2C01, C2C02, C2C11, C2C12, . . . , C2Cm1, C2Cm2 may convert an input signal having the CML level into a signal having the CMOS level and output the signal having the CMOS level.

The plurality of converters C2C01, C2C02, C2C11, C2C12, ..., C2Cm1, C2Cm2 may convert the first divided multiphase clock signals ICK, QCK, ICKB, and QCKB and the second divided multiphase clock signals OCK0, OCK2, OCK4, and OCK6, which are inputted at the CML level, into signals having the CMOS level and provide the signals having the CMOS level to the input/output terminal 150-1.

The input/output terminal 150-1 may include a plurality of receivers RX0 to RXm, a plurality of transmitters TX0 to TXm, and input/output pads DQ0 to DQm.

A pair of transmitter/receiver may be electrically connected to each of the input/output pads DQ0 to DQm, and one converter may be electrically connected to each of the transmitter and the receiver.

For example, the transmitter TX0 and the receiver RX0 may be electrically connected to the input/output pad DQ0, and the converter C2C01 may be electrically connected to the transmitter TX0. The converter C2C02 may be electrically connected to the receiver RX0. A data line IO0 may be electrically connected to the transmitter TX0 and the receiver RX0.

The converter C2C01 may convert the second divided multiphase clock signals OCK0, OCK2, OCK4, and OCK6 inputted at the CML level into signals having the CMOS level as illustrated In FIG. 5, and may provide the signals having the CMOS level to the transmitter TX0 and the receiver RX0.

The converter C2C02 may convert the first divided multiphase clock signals ICK, QCK, ICKB, and QCKB inputted at the CML level into signals having the CMOS level as illustrated in FIG. 5, and may provide the signals having the CMOS level to the transmitter TX0 and the receiver RX0.

The transmitter TX0 may receive data, which is transmitted from a memory block (not illustrated) through the data line IO0, according to the first divided multiphase clock signals ICK, QCK, ICKB, and QCKB, and output the received data to the input/output pad DQ0 according to the second divided multiphase clock signals OCK0, OCK2, OCK4, and OCK6.

The receiver RX0 may receive data, which is inputted to the input/output pad DQ0, according to the first divided multiphase clock signals ICK, QCK, ICKB, and QCKB, and transmit the data to the memory block through the data line IO0 according to the second divided multiphase clock signals OCK0, OCK2, OCK4, and OCK6.

Figure 6:
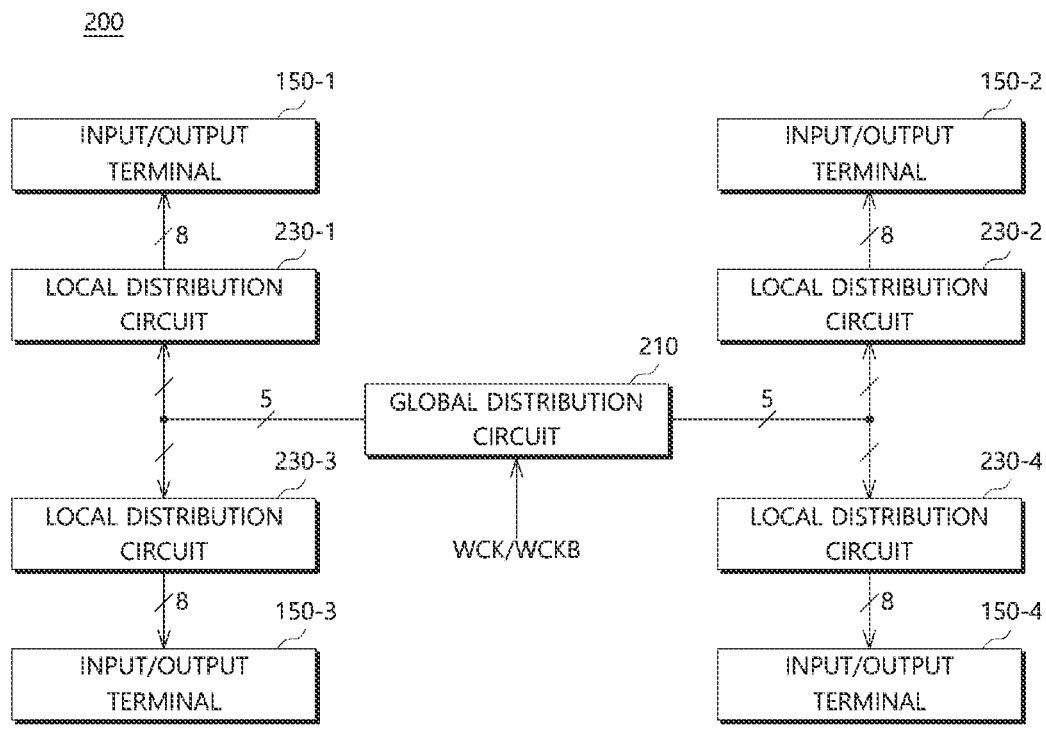
FIG. 6 is a block diagram illustrating a configuration of a semiconductor apparatus in accordance with another embodiment.

FIG. 6 is a block diagram illustrating a configuration of a semiconductor apparatus 200 in accordance with another embodiment of the present disclosure.

Referring to FIG. 6, the semiconductor apparatus 200 in accordance with the embodiment of FIG. 6 may include a global distribution circuit 210, a plurality of local distribution circuits 230-1 to 230-4, and a plurality of input/output terminals 150-1 to 150-4.

The global distribution circuit 210 may divide the external clock signals WCK/WCKB to generate first divided multiphase clock signals and divide any one of the first divided multiphase clock signals to generate a reference clock signal. For example, the first divided multiphase clock signals may be 4-phase clock signals obtained by 2-dividing the external clock signals WCK/WCKB, and the reference clock signal may be any one of the 4-phase clock signals obtained by 2-dividing the first divided multiphase clock signals.

Eight global signal lines may be electrically connected to the global distribution circuit 110, described with reference to FIG. 2, in order to transmit the 4-phase first divided multiphase clock signals and the 4-phase second divided multiphase clock signals to the plurality of local distribution circuits 130-1 to 130-4.

On the other hand, the global distribution circuit 210 of FIG. 6 transmits the 4-phase first divided multiphase clock signals and the 1-phase reference clock signal to the plurality of local distribution circuits 230-1 to 230-4. Therefore, five global signal lines smaller than eight global signal lines may be electrically connected to the global distribution circuit 210.

As the number of global signal lines for transmitting the clock signals is reduced, it is possible to reduce power consumption of the semiconductor apparatus, which is accomplished in the present disclosure.

The first divided multiphase clock signals may each have the CML level. The level of the reference clock signal may be converted into the CMOS level by the global distribution circuit 210 itself.

The plurality of local distribution circuits 230-1 to 230-4 may have substantially the same configuration.

The local distribution circuit 230-1 may convert the first divided multiphase clock signals into signals having the CMOS level and output the signals having the CMOS level, and generate the second divided multiphase clock signals according to the reference clock signal and a portion of the first divided multiphase clock signals.

The first divided multiphase clock signals and the second divided multiphase clock signals, which are outputted from each of the plurality of local distribution circuits 230-1 to 230-4, may be provided to each of the plurality of input/output terminals 150-1 to 150-4.

The plurality of input/output terminals 150-1 to 150-4 may perform data transmission and reception according to the first divided multiphase clock signals and the second divided multiphase clock signals.

The plurality of input/output terminals 150-1 to 150-4 may have substantially the same configuration.

Each of the plurality of input/output terminals 150-1 to 150-4 may include an input/output pad and a transmission/reception circuit.

Figure 7:
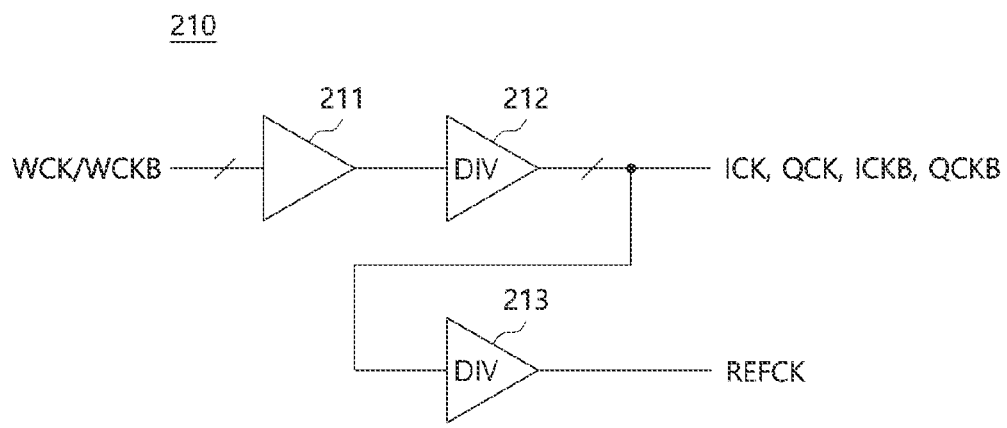
FIG. 7 is a diagram illustrating a configuration of a global distribution circuit of FIG. 6.

FIG. 7 is a diagram illustrating a configuration of the global distribution circuit 210 of FIG. 6.

Referring to FIG. 7, the global distribution circuit 210 may include a buffer 211, a first divider (DIV) 212, and a second divider (DIV) 213.

The first divider (DIV) 212 may divide the external clock signals WCK/WCKB received through the buffer 211 to generate the first divided multiphase clock signals ICK, QCK, ICKB, and QCKB.

For example, the first divided multiphase clock signals ICK, QCK, ICKB, and QCKB may be generated by 2-dividing the external clock signals WCK/WCKB. The first divided multiphase clock signals ICK, QCK, ICKB, and QCKB may have a frequency corresponding to ½ of that of the external clock signals WCK/WCKB.

The second divider (DIV) 213 may output, as a reference clock signal REFCK, one of signals generated by dividing the first divided multiphase clock signals ICK, QCK, ICKB, and QCKB.

The second divider (DIV) 213 may also be configured to generate the reference clock signal REFCK by dividing one (for example, ICK) of the first divided multiphase clock signals ICK, QCK, ICKB, and QCKB.

The second divider (DIV) 213 may convert the reference clock signal REFCK into a signal having the CMOS level and output the signal having the CMOS level.

The reference clock signal REFCK may have a frequency corresponding to ½ of that of the first divided multiphase clock signals ICK, QCK, ICKB, and QCKB and have a frequency corresponding to ¼ of that of the external clock signals WCK/WCKB.

Figure 8:
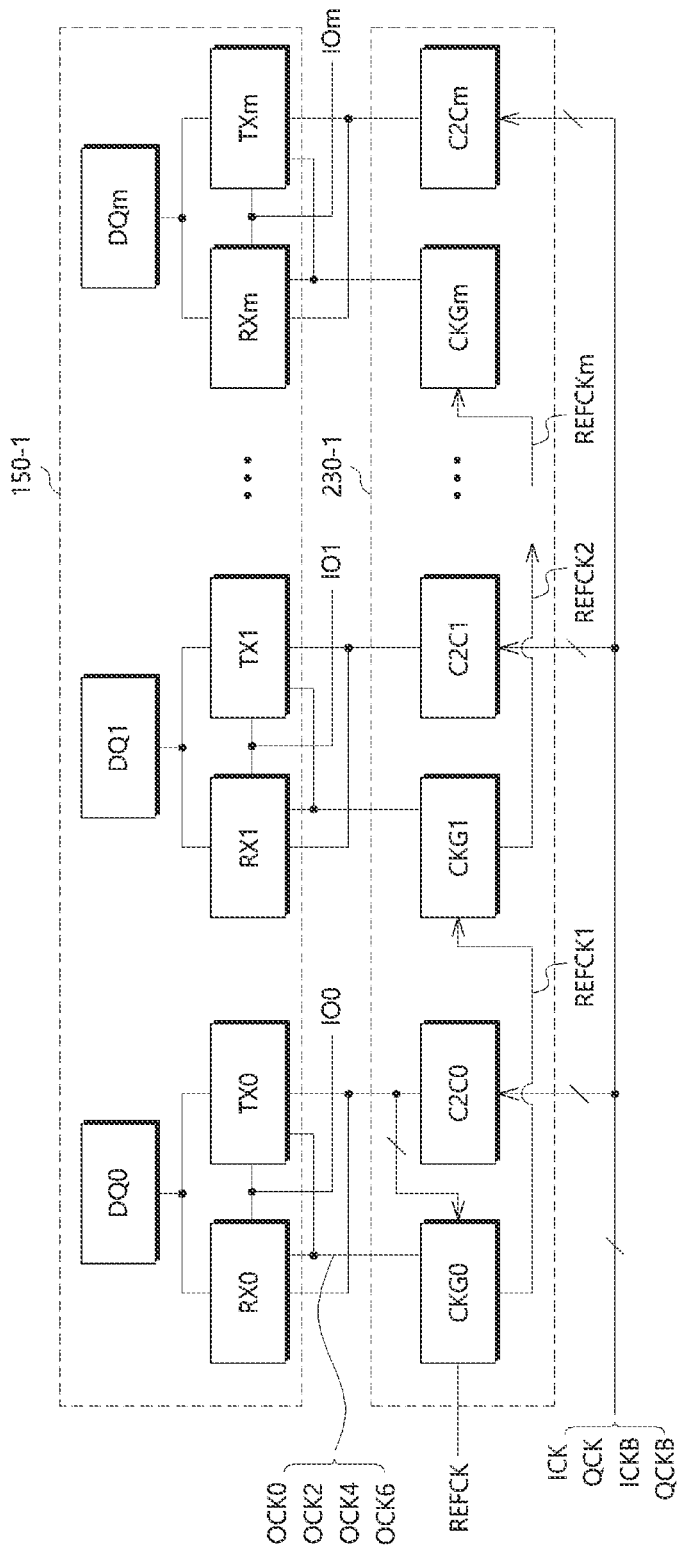
FIG. 8 is a block diagram illustrating a configuration of a local distribution circuit and an input/output terminal of FIG. 6.
Figure 9:
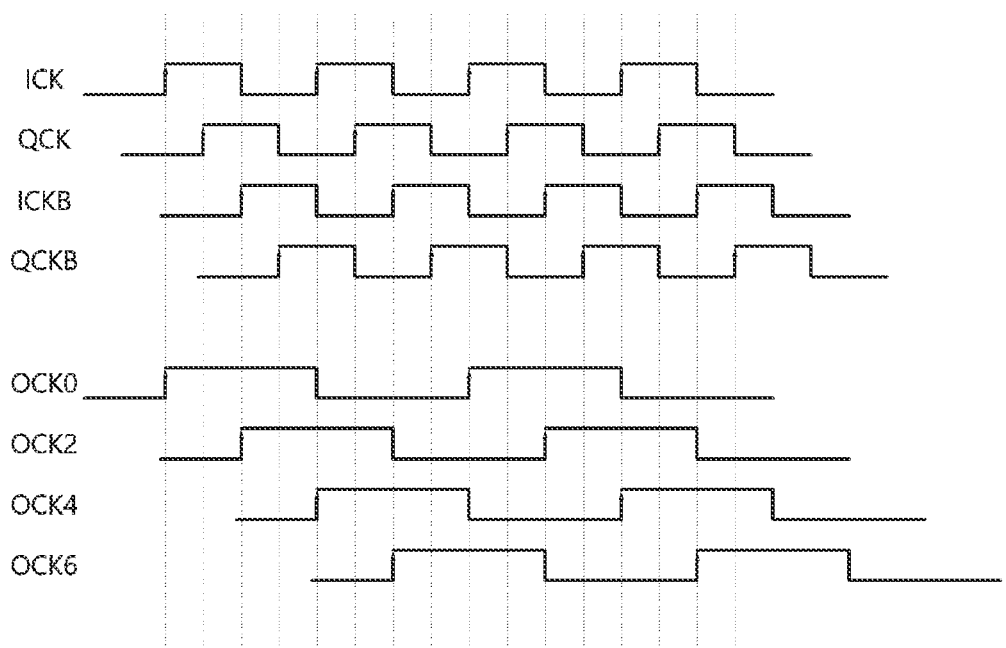
FIG. 9 is a diagram illustrating an output waveform of the local distribution circuit of FIG. 8.

FIG. 8 is a block diagram illustrating a configuration of the local distribution circuit 230-1 and the input/output terminal 150-1 of FIG. 6. FIG. 9 is a diagram illustrating an output waveform of the local distribution circuit 230-1 of FIG. 6.

Referring to FIG. 8, the local distribution circuit 230-1 may include a plurality of converters C2C0, C2C1, . . . , C2Cm and a plurality of clock generation circuits CKG0 to CKGm.

Each of the plurality of converters C2C0, C2C1, . . . , C2Cm may convert an input signal having the CML level into a signal having the CMOS level and output the signal having the CMOS level.

The plurality of converters C2C0, C2C1, . . . , C2Cm may convert the first divided multiphase clock signals ICK, QCK, ICKB, and QCKB inputted at the CML level into signals having the CMOS level and provide the converted signals to the input/output terminal 150-1.

The converter C2C0 may convert the first divided multiphase clock signals ICK, QCK, ICKB, and QCKB inputted at the CML level into signals having the CMOS level as illustrated in FIG. 9, and provide the signals having the CMOS level to a transmitter TX0 and a receiver RX0.

The converter C2C1 may convert the first divided multiphase clock signals ICK, QCK, ICKB, and QCKB inputted at the CML level into signals having the CMOS level as illustrated in FIG. 9, and provide the signals having the CMOS level to a transmitter TX1 and a receiver RX1.

The converter C2Cm may convert the first divided multiphase clock signals ICK, QCK, ICKB, and QCKB inputted at the CML level into signals having the CMOS level as illustrated in FIG. 9, and provide the signals having the CMOS level to a transmitter TXm and a receiver RXm.

The plurality of clock generation circuits CKG0 to CKGm may have substantially the same configuration.

Each of the plurality of clock generation circuits CKG0 to CKGm may generate the second divided multiphase clock signals OCK0, OCK2, OCK4, and OCK6 according to one, which corresponds to each of the plurality of clock generation circuits CKG0 to CKGm among the reference clock signal REFCK and shifted reference clock signals REFCK1, REFCK2, . . . , REFCKm, and a portion (for example, ICK and ICKB) of the first divided multiphase clock signals ICK, QCK, ICKB, and QCKB.

Each of the plurality of clock generation circuits CKG0 to CKGm may generate another one corresponding to the next order according to one corresponding to each of the plurality of clock generation circuits CKG0 to CKGm among the reference clock signal REFCK and the shifted reference clock signals REFCK1, REFCK2, . . . , REFCKm.

The clock generation circuit CKG0 may generate the second divided multiphase clock signals OCK0, OCK2, OCK4, and OCK6 and the shifted reference clock signal REFCK1 according to the reference clock signal REFCK and the first divided multiphase clock signals ICK and ICKB.

The clock generation circuit CKG1 may generate the second divided multiphase clock signals OCK0, OCK2, OCK4, and OCK6 and the shifted reference clock signal REFCK2 according to the shifted reference clock signal REFCK1 and the first divided multiphase clock signals ICK and ICKB.

The clock generation circuit CKGm may generate the second divided multiphase clock signals OCK0, OCK2, OCK4, and OCK6 according to the shifted reference clock signal REFCKm outputted from the clock generation circuit CKGm-1 (not illustrated) of a previous stage and the first divided multiphase clock signals ICK and ICKB.

The input/output terminal 150-1 may include the plurality of receivers RX0 to RXm, the plurality of transmitters TX0 to TXm, and input/output pads DQ0 to DQm.

A pair of transmitter/receiver may be electrically connected to each of the input/output pads DQ0 to DQm, and one converter may be electrically connected to both the transmitter and the receiver.

For example, the transmitter TX0 and the receiver RX0 may be electrically connected to the input/output pad DQ0, and the converter C2C0 may be electrically connected to both the transmitter TX0 and the receiver RX0. A data line IO0 may be electrically connected to the transmitter TX0 and the receiver RX0.

The transmitter TX0 may receive data, which is transmitted from a memory block (not illustrated) through the data line IO0, according to the first divided multiphase clock signals ICK, QCK, ICKB, and QCKB, and output the received data to the input/output pad DQ0 according to the second divided multiphase clock signals OCK0, OCK2, OCK4, and OCK6.

The receiver RX0 may receive data, which is inputted to the input/output pad DQ0, according to the first divided multiphase clock signals ICK, QCK, ICKB, and QCKB, and transmit the data to the memory block through the data line IO0 according to the second divided multiphase clock signals OCK0, OCK2, OCK4, and OCK6.

Figure 10:
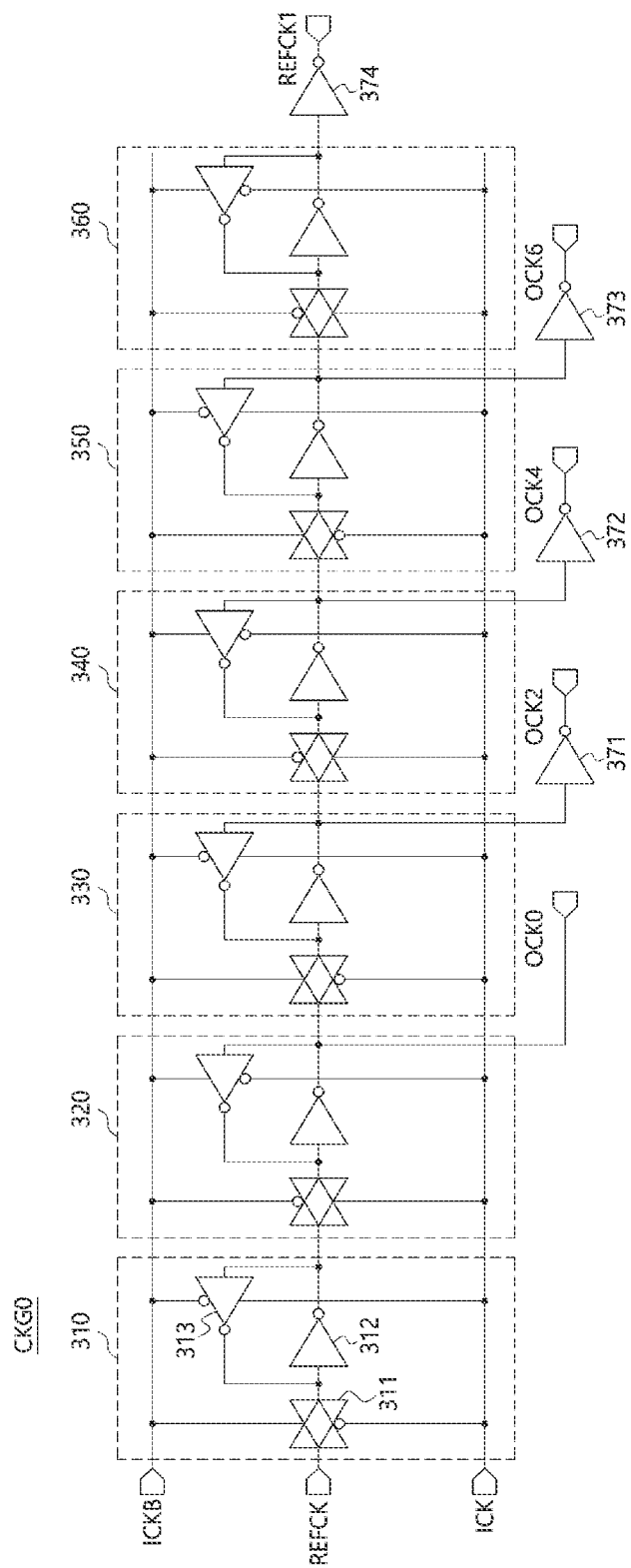
FIG. 10 is a diagram illustrating a configuration of a clock generation circuit of FIG. 8.
Figure 11:
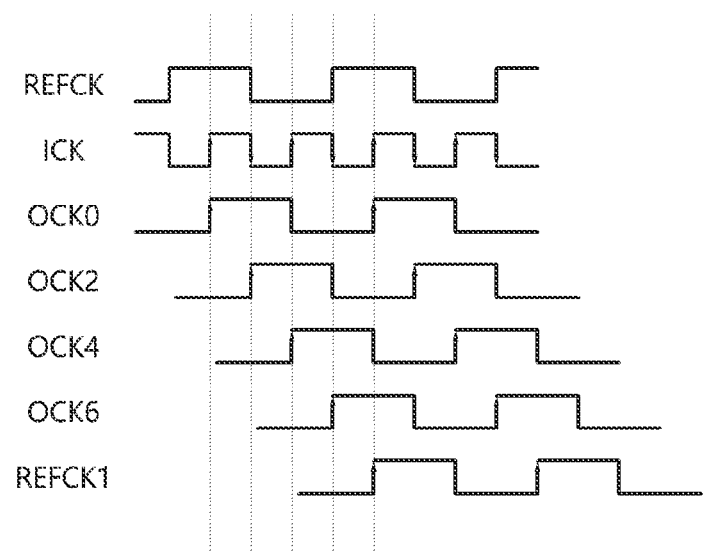
FIG. 11 is a diagram illustrating an output waveform of the clock generation circuit of FIG. 10.

FIG. 10 is a diagram illustrating a configuration of the clock generation circuit CKG0 of FIG. 8, and FIG. 11 is a diagram illustrating an output waveform of the clock generation circuit CKG0 of FIG. 10.

Referring to FIG. 10, the clock generation circuit CKG0 may shift the reference clock signal REFCK according to the first divided multiphase clock signals ICK and ICKB to generate the second divided multiphase clock signals OCK0, OCK2, OCK4, and OCK6 and the shifted reference clock signal REFCK1.

The clock generation circuit CKG0 may include a plurality of flip-flops 310, 320, 330, 340, 350, and 360 and a plurality of inverters 371 to 374.

A first flip-flop 310 may allow the reference clock signal REFCK to pass therethrough according to a falling edge of ICK and a rising edge of ICKB.

A second flip-flop 320 may allow an output signal of the first flip-flop 310 to pass therethrough according to a rising edge of ICK and a falling edge of ICKB.

An output signal of the second flip-flop 320 may be output as OCK0 among the second divided multiphase clock signals OCK0, OCK2, OCK4, and OCK6.

A third flip-flop 330 may allow the output signal of the second flip-flop 320, that is, OCK0, to pass therethrough according to the falling edge of ICK and the rising edge of ICKB.

An output signal of the third flip-flop 330 may be output as OCK2 among the second divided multiphase clock signals OCK0, OCK2, OCK4, and OCK6 via the inverter 371.

A fourth flip-flop 340 may allow the output signal of the third flip-flop 330, that is, OCK2, to pass therethrough according to the rising edge of ICK and the falling edge of ICKB.

An output signal of the fourth flip-flop 340 may be output as OCK4 among the second divided multiphase clock signals OCK0, OCK2, OCK4, and OCK6 via the inverter 372.

A fifth flip-flop 350 may allow the output signal of the fourth flip-flop 340, that is, OCK4, to pass therethrough according to the falling edge of ICK and the rising edge of ICKB.

An output signal of the fifth flip-flop 350 may be output as OCK6 among the second divided multiphase clock signals OCK0, OCK2, OCK4, and OCK6 via the inverter 373.

A sixth flip-flop 360 may allow the output signal of the fifth flip-flop 350, that is, OCK6, to pass therethrough according to the rising edge of ICK and the falling edge of ICKB.

An output signal of the sixth flip-flop 360 may be output as the shifted reference clock signal REFCK1 via the inverter 374.

The shifted reference clock signal REFCK1 may be provided to the clock generation circuit CKG1 adjacent to the clock generation circuit CKG0.

The plurality of flip-flops 310, 320, 330, 340, 350, and 360 may have substantially the same configuration.

For example, the first flip-flop 310 may include a pass gate 311 and latches 312 and 313.

The pass gate 311 may receive the reference clock signal REFCK according to the falling edge of ICK and the rising edge of ICKB.

The latches 312 and 313 may latch an output signal of the pass gate 311 according to the rising edge of ICK and the falling edge of ICKB.

As illustrated in FIG. 11, the clock generation circuit CKG0 may align the second divided multiphase clock signals OCK0, OCK2, OCK4, and OCK6 at an interval of 1 unit interval (UI) on the basis of ICK.

The clock generation circuit CKG0 samples the reference clock signal REFCK, which is obtained by 4-dividing the external clock signals WCK/WCKB, on the basis of ICK obtained by 2-dividing the external clock signals WCK/WCKB, so that it is possible to stably secure a timing margin for generating the second divided multiphase clock signals OCK0, OCK2, OCK4, and OCK6.

The timing margin is stably secured in the process of generating the second divided multiphase clock signals OCK0, OCK2, OCK4, and OCK6, so that it is possible to reduce a skew in the clock signal distribution process.

As described above, a person skilled in the art to which the present disclosure pertains can understand that the present disclosure may be carried out in other specific forms without changing its technical spirit or essential features. Therefore, it should be understood that the embodiments described above are illustrative in all respects, not limitative. The scope of the present disclosure is defined by the claims to be described below rather than the detailed description, and it should be construed that the meaning and scope of the claims and all changes or modified forms derived from the equivalent concept thereof are included in the scope of the present disclosure.

What is claimed is:

1. A clock distribution circuit comprising:
    a global distribution circuit configured to divide external clock signals to generate first divided multiphase clock signals and divide one of the first divided multiphase clock signals to generate a reference clock signal; and
    a local distribution circuit configured to generate second divided multiphase clock signals according to a portion of the first divided multiphase clock signals and the reference clock signal.

2. The clock distribution circuit according to claim 1, wherein the global distribution circuit comprises:
    a first divider configured to divide the external clock signals to generate the first divided multiphase clock signals; and
    a second divider configured to output, as the reference clock signal, one of signals generated by dividing the first divided multiphase clock signals.

3. The clock distribution circuit according to claim 2, wherein the second divider is configured to convert the one of the signals generated by dividing the first divided multiphase clock signals having a current mode logic (CML) level into a signal having a complementary metal-oxide semiconductor (CMOS) level, and to output the signal having the CMOS level as the reference clock signal.

4. The clock distribution circuit according to claim 1, wherein the global distribution circuit comprises:
    a first divider configured to divide the external clock signals to generate the first divided multiphase clock signals; and
    a second divider configured to divide one of the first divided multiphase clock signals and output the divided signal as the reference clock signal.

5. The clock distribution circuit according to claim 1, wherein the local distribution circuit is configured to convert the first divided multiphase clock signals into signals having a CMOS level and output signals having the CMOS level.

6. The clock distribution circuit according to claim 1, wherein the local distribution circuit comprises:
    a plurality of converters each configured to convert the first divided multiphase clock signals, which are inputted at a CML level, into CMOS level signals and output the CMOS level signals; and
    a plurality of clock generation circuits each configured to generate the second divided multiphase clock signals according to one clock generation circuit, which corresponds to each of the plurality of clock generation circuits among the reference clock signal and shifted reference clock signals, and a portion of the first divided multiphase clock signals.

7. The clock distribution circuit according to claim 6, wherein the plurality of clock generation circuits are each configured to generate the second divided multiphase clock signals and the shifted reference clock signal by shifting the reference clock signal according to a portion of the first divided multiphase clock signals.

8. A semiconductor apparatus comprising:
    a first divider configured to divide external clock signals to generate first divided multiphase clock signals;
    a second divider configured to output, as a reference clock signal, one of signals generated by dividing the first divided multiphase clock signals;
    a plurality of clock generation circuits each configured to generate second divided multiphase clock signals according to one clock generation circuit, which corresponds to each of the plurality of clock generation circuits among the reference clock signal and shifted reference clock signals, and a portion of the first divided multiphase clock signals; and
    a plurality of input/output terminals each configured to perform data transmission and reception according to the first divided multiphase clock signals and the second divided multiphase clock signals.

9. The semiconductor apparatus according to claim 8, wherein the second divider is configured to convert the one of the signals generated by dividing the first divided multiphase clock signals having a current mode logic (CML)

level into a complementary metal-oxide semiconductor (CMOS) level signal, and to output the CMOS level signal as the reference clock signal.

10. The semiconductor apparatus according to claim 8, further comprising:
a plurality of converters each configured to convert the first divided multiphase clock signals, which are inputted at a CML level, into CMOS level signals and output the CMOS level signals.

11. The semiconductor apparatus according to claim 8, wherein the plurality of clock generation circuits are each configured to generate the second divided multiphase clock signals and shifted reference clock signals by shifting the reference clock signal according to a portion of the first divided multiphase clock signals.

12. The semiconductor apparatus according to claim 8, wherein each of the plurality of input/output terminals comprises:
an input/output pad;
a transmitter configured to receive data, which is transmitted from a memory block through a data line, according to the first divided multiphase clock signals, and to output the received data to the input/output pad according to the second divided multiphase clock signals; and
a receiver configured to receive data, which is inputted to the input/output pad, according to the first divided multiphase clock signals, and to transmit the data to the memory block through the data line according to the second divided multiphase clock signals.

13. A semiconductor apparatus comprising:
a plurality of input/output terminals each configured to perform data transmission and reception according to first divided multiphase clock signals of at least 2-phase or more and second divided multiphase clock signals of at least 2-phase;
a global distribution circuit configured to divide external clock signals to generate the first divided multiphase clock signals and divide one of the first divided multiphase clock signals to generate a 1-phase reference clock signal; and
a local distribution circuit configured to generate the second divided multiphase clock signals according to a portion of the first divided multiphase clock signals and the 1-phase reference clock signal.

14. The semiconductor apparatus according to claim 13, wherein each of the plurality of input/output terminals comprises:
an input/output pad;
a transmitter configured to receive data, which is transmitted from a memory block through a data line, according to the first divided multiphase clock signals, and to output the received data to the input/output pad according to the second divided multiphase clock signals; and
a receiver configured to receive data, which is inputted to the input/output pad, according to the first divided multiphase clock signals, and to transmit the data to the memory block through the data line according to the second divided multiphase clock signals.

15. The semiconductor apparatus according to claim 13, wherein the global distribution circuit comprises:
a first divider configured to divide the external clock signals to generate the first divided multiphase clock signals; and
a second divider configured to output, as the reference clock signal, one of signals generated by dividing the first divided multiphase clock signals.

16. The semiconductor apparatus according to claim 15, wherein the second divider is configured to convert one of the signals generated by dividing the first divided multiphase clock signals having a current mode logic (CML) level into a complementary metal-oxide semiconductor (CMOS) level signal, and to output the CMOS level signal as the reference clock signal.

17. The semiconductor apparatus according to claim 13, wherein the global distribution circuit comprises:
a first divider configured to divide the external clock signals to generate the first divided multiphase clock signals; and
a second divider configured to divide one of the first divided multiphase clock signals and output the divided signal as the reference clock signal.

18. The semiconductor apparatus according to claim 13, wherein the local distribution circuit is configured to convert the first divided multiphase clock signals into CMOS level signals and output the CMOS level signals.

19. The semiconductor apparatus according to claim 13, wherein the local distribution circuit comprises:
a plurality of converters each configured to convert the first divided multiphase clock signals inputted at a CML level into CMOS level signals and output the CMOS signals; and
a plurality of clock generation circuits each configured to generate the second divided multiphase clock signals according to one clock generation circuit, which corresponds to each of the plurality of clock generation circuits among the reference clock signal and shifted reference clock signals, and a portion of the first divided multiphase clock signals.

20. The semiconductor apparatus according to claim 19, wherein the plurality of clock generation circuits are each configured to generate the second divided multiphase clock signals and the shifted reference clock signal by shifting the reference clock signal according to some of the first divided multiphase clock signals.

* * * * *